United States Patent
Moffa et al.

(10) Patent No.: US 6,563,462 B1
(45) Date of Patent: May 13, 2003

(54) MILLIMETER-WAVE CAMERA FOR RADIOMETRIC IMAGING AND COMMUNICATIONS

(75) Inventors: Philip J. Moffa, Torrance, CA (US); Merit M. Shoucri, Manhattan Beach, CA (US); Mikio L. Yujiri, Redondo Beach, CA (US)

(73) Assignee: Northrop Grumman Corporation, Redondo Beach, CA (US)

( * ) Notice: Subject to any disclaimer, the term of this patent is extended or adjusted under 35 U.S.C. 154(b) by 0 days.

(21) Appl. No.: 09/981,931

(22) Filed: Oct. 17, 2001

(51) Int. Cl.[7] ................................................. G01S 3/02
(52) U.S. Cl. ........................ 342/465; 342/351; 342/385
(58) Field of Search ................................. 342/351, 465, 342/385, 386

(56) References Cited

U.S. PATENT DOCUMENTS

| | | | |
|---|---|---|---|
| 4,940,986 A | | 7/1990 | Huguenin |
| 5,073,782 A | * | 12/1991 | Huguenin et al. .......... 342/179 |
| 5,237,334 A | * | 8/1993 | Waters ........................ 343/753 |
| 5,351,077 A | | 9/1994 | Lee et al. |
| 5,438,336 A | | 8/1995 | Lee et al. |
| 5,486,832 A | * | 1/1996 | Hulderman .................. 342/70 |
| 5,999,122 A | | 12/1999 | Shoucri et al. |
| 6,040,801 A | * | 3/2000 | Dawirs ........................ 342/385 |
| 6,072,433 A | * | 6/2000 | Young et al. ............... 342/386 |

OTHER PUBLICATIONS

"Passive Millimeter Wave Camera", TRW Marketing Brochure, 1999.
"Evaders Night Vision Imaging System", Night Vision Equipment Co. Marketing Brochure, 2001.

* cited by examiner

*Primary Examiner*—Theodore M. Blum
(74) *Attorney, Agent, or Firm*—Harness, Dickey & Pierce, P.L.C.

(57) ABSTRACT

An imaging system (10) that includes a passive millimeter-wave camera (14) employing a focal plane array (60) of millimeter-wave integrated circuitry receivers (32). The camera (14) images a scene (58) that may include one or more beacons (12). The beacons (12) transmit millimeter-wave radiation signals (16) that are modulated by a modulator (24) so that the beacons (12) can be distinguished, and possibly provide communications in addition to beacon location. The receivers (32) in the camera (14) employ a demodulator (40) to demodulate the detected millimeter-wave signals from the scene (58). Therefore, not only does the camera (14) image the beacons (12) in the scene (58), but also can separate and decipher communications signals from the beacons (12).

16 Claims, 3 Drawing Sheets

MILLIMETER-WAVE CAMERA FOR RADIOMETRIC IMAGING AND COMMUNICATIONS

BACKGROUND OF THE INVENTION

1. Field of the Invention

This invention relates generally to a millimeter-wave camera providing both scene imaging and communications and, more particularly, to a millimeter-wave camera that passively receives millimeter-wave radiation from a scene, and demodulates transmitted signals within the scene to provide transmitter location and communications at millimeter-wave frequencies.

2. Discussion of the Related Art

Millimeter-wave cameras are known in the art that passively detect millimeter-wave radiation (30–300 GHz) emitted by objects in a scene. Passive detection of millimeter-wave radiation for imaging purposes provides certain advantages over other types of imaging systems that detect visible light, infrared radiation or other electro-optical radiation. These advantages are available because millimeter-wave radiation is able to penetrate low visibility and obscured atmospheric conditions caused by many factors, including clouds, fog, haze, rain, dust, smoke, sandstorms, etc., without significant attenuation, as would occur with other types of radiation. More particularly, certain propagation wavelengths in the millimeter-wave spectrum, such as W-band wavelengths in the atmospheric window around 94 GHz, are not significantly attenuated by oxygen and water vapor in, air. Millimeter-wave radiation is also effective in passing through certain hard substances, such as wood and drywall, to provide imaging capability through walls. Thus, millimeter-wave imaging is desirable for many application, such as aircraft landing, collision avoidance and detection systems, detection and tracking systems, surveillance systems, etc. Virtually any type of imaging system that can benefit by providing quality images under low visibility conditions can benefit using millimeter-wave imaging.

Millimeter-wave imaging systems that employ a focal plane array to detect millimeter-wave radiation in a scene are known in the art. For example, a passive millimeter-wave camera (PMMC) for many applications is available from TRW. Individual millimeter-wave receivers make up the focal plane array, where each receiver includes a millimeter-wave antenna and detector circuitry. An array interface multiplexer is employed that multiplexes the electrical signals from each of the receivers to a signal processing system.

A millimeter-wave imaging system employing a focal plane imaging array of this type is disclosed in U.S. Pat. No. 5,438,336 issued to Lee et al., titled "Focal Plane Imaging Array with Internal Calibration Source," assigned to the Assignee this application, and herein incorporated by reference. The system includes an optical lens that focuses millimeter-wave radiation collected from a scene onto an array of pixel-element receivers positioned in the focal plane of the lens. Each pixel element receiver includes an antenna that receives the millimeter-wave radiation, a low noise amplifier that amplifies the received millimeter-wave signal, a band pass filter that filters the received signal to only pass millimeter-wave radiation of a predetermined wavelength, and a diode integration detector that detects the millimeter-wave radiation and generates an electrical signal. The signal from each diode detector is then sent to an array interface unit that multiplexes the electrical signals to a central processing unit to be displayed on a suitable display unit. Each pixel element receiver includes a calibration circuit to provide a background reference signal to the detector.

SUMMARY OF THE INVENTION

In accordance with the teachings of the present invention, an imaging and communications system is disclosed that includes a passive millimeter-wave camera employing a focal plane array of millimeter-wave integrated circuit receivers. The camera images a scene that may include one or more beacons. The beacons transmit millimeter-wave signals that are modulated by a suitable modulation device so that the beacons can provide communications signals. The receivers in the camera employ a demodulator to demodulate the detected millimeter-wave signals from the scene. Therefore, not only does the camera image the beacons in the scene to provide beacon location, but also can separate and decipher communications signals from the beacons. Thus, the camera provides a gray-scale image of the scene identifying the location of the beacons and a decoded image of the scene to separately identify and/or communicate with each beacon.

Additional objects, advantages and features of the present invention will become apparent from the following description and appended claims, taken in conjunction with the accompanying drawings.

DETAILED DISCUSSION OF THE EMBODIMENTS

The following discussion of the embodiments of the invention directed, to a passive millimeter-wave camera used for both imaging and communications is merely exemplary in nature, and is in no way, intended to limit the invention or its applications or uses.

Figure 1:
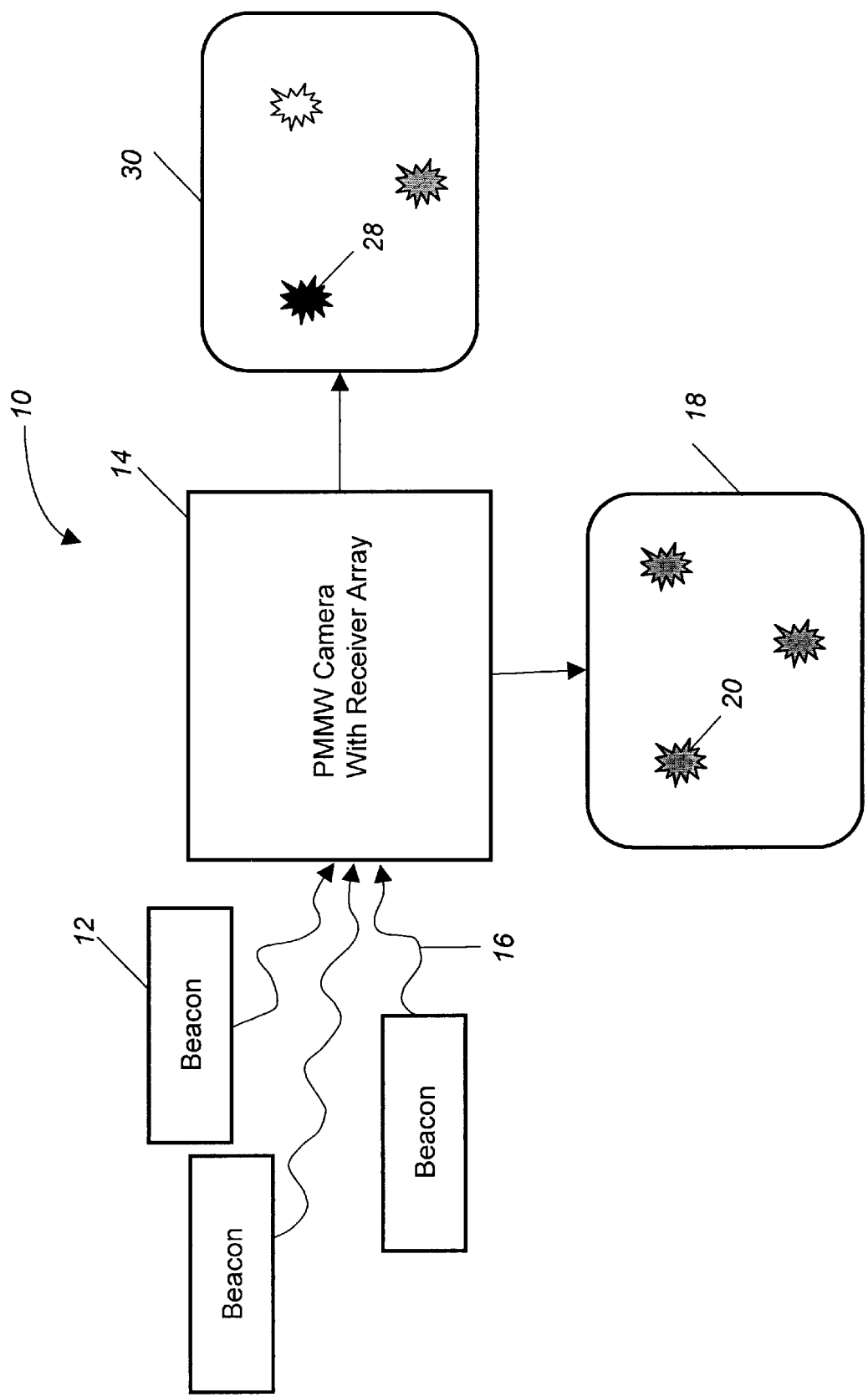
FIG. 1 is a block diagram of a passive millimeter-wave camera and beacon system, according to an embodiment of the present invention.

FIG. 1 is a plan view of a millimeter-wave imaging system 10, according to the invention. The imaging system 10 includes a plurality of beacons 12 that are within a scene being imaged by a passive millimeter-wave (PMMW), camera 14, according to the invention. The beacons 12 transmit a modulated millimeter-wave radiation signal 16 that is detected by the camera 14. Thus, each radiation signal 16 emitted by a separate beacon 12 is distinguished from the signals 16 of the other beacons 12. The camera 14 is able to demodulate each of the radiation signals 16 so that the image generated by the camera 14 can separately identify each beacon 12.

Because the camera 14 discriminately detects the radiation signals 16 from the various beacons 12 in this scene, not only is the camera 14 able to generate a gray-scale image 18 identifying a location 20 of each of the signals 16 from the various beacons 12 in the scene, but also is able to identify which beacon 12 is located at what location in the scene as shown by decoded locations 28 in an image 30. Thus, because the radiation signals 16 are modulated millimeter-wave signals, and the receivers in the camera 14 demodulate the modulated signals 16, the camera 14 is able to decode communications from the beacons 12.

Figure 2:
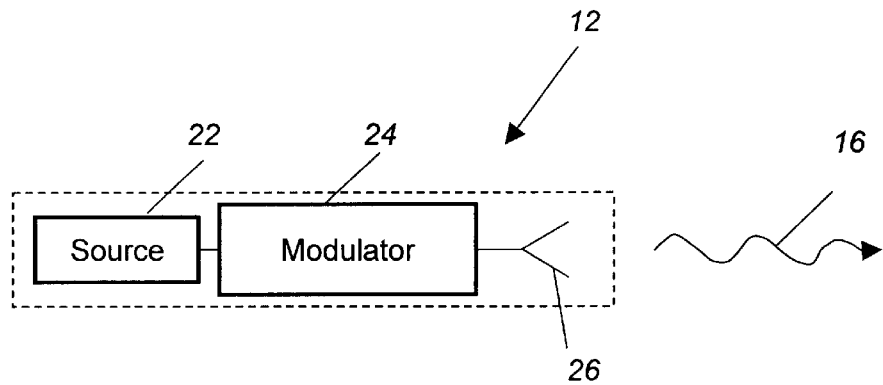
FIG. 2 is a schematic block diagram of one of the beacons shown in FIG. 1.

FIG. 2 is a schematic block diagram of one of the beacons 12 including a millimeter-wave signal source 22, a modulator 24 and an antenna 26. The millimeter-wave source 22 generates a millimeter-wave signal and the modulator 24 modulates the signal by a certain modulation scheme. The modulated millimeter-wave signal is transmitted by the antenna 26 to be detected by the camera 14. Any millimeter-wave source and modulator can be used that is suitable for the purposes of the present invention.

According to the invention, the modulator 24 modulates the millimeter-wave signal from the source 22 by any suitable modulation scheme. The specific modulation scheme, or the mariner in which the modulation is provided would be well known to those skilled in the art. The present invention envisions any modulation technique suitable for millimeter-wave signal transmission. Amplitude modulation would be the communication technique most easily implemented in the present design. For binary signal transmission, amplitude modulation is typically referred to as on/off keying (OOK) or amplitude shift keying (ASK). When the source 22 is on, a one bit is being transmitted by the antenna 26 and when the source 22 is off, a zero bit is being transmitted. However, various other modulation schemes known in analog and digital communications can be used besides amplitude modulation.

Other suitable modulation schemes include frequency shifting and phase shifting, or some combination of amplitude, phase and frequency shifting of the carrier wave. Any and all of these approaches could be employed in combination with the beacons 12 and the PMMW camera 14. Specific examples include phase shift keying (PSK), frequency shift keying (FSK) or quadrature amplitude modulation (QAM).

A known FSK approach is to utilize one frequency to represent a zero bit and another frequency to represent a one bit. For PSK, two common approaches are referred to as binary phase shift keying (BPSK) and quadrature phase shift keying (QPSK). In BPSK, two carrier waves with different phases, typically 180° out of phase with each other, represent a zero and a one bit. In QPSK, four phases are utilized and each phase represents two bits. The in-phase (I) and the quadrature phase (Q) plot of these signals would lie on a circle because all of the signals have the same amplitude, but different phases. For QAM, the I and Q signals are amplitude modulated separately. A commonly used version is referred to as 16-level QAM. In that design, four bits are represented by each signal.

Figure 3:
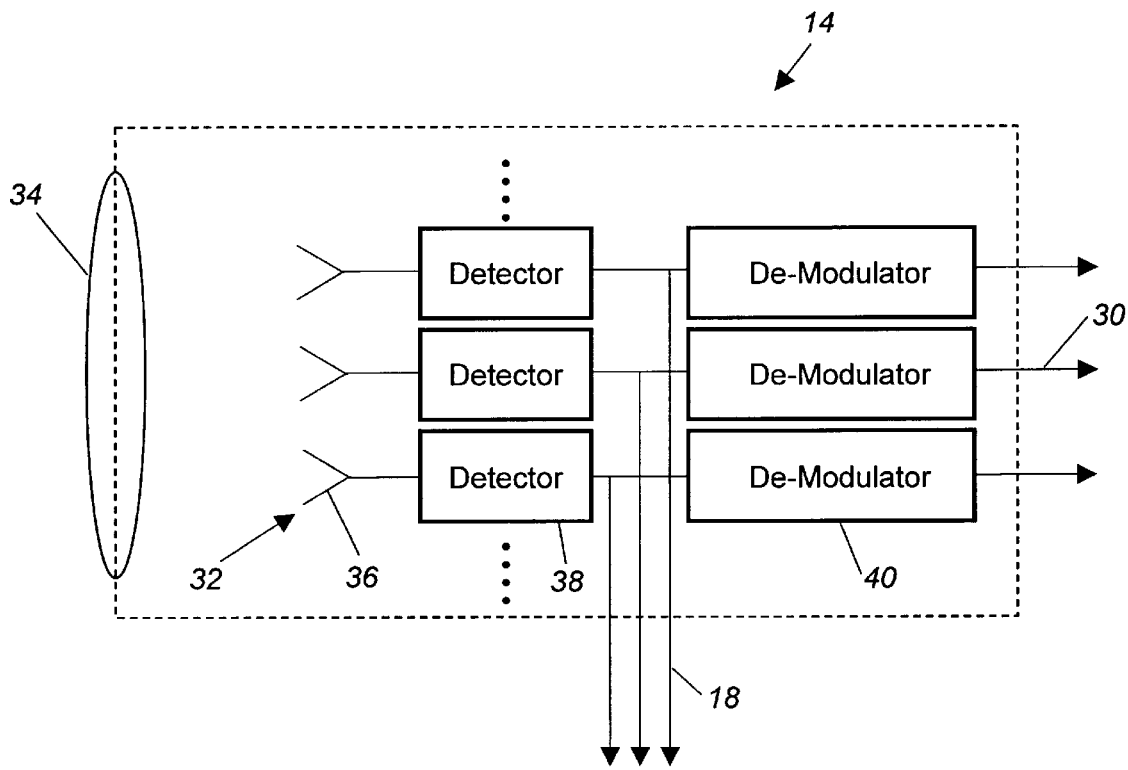
FIG. 3,is a schematic block diagram of the passive millimeter-wave camera shown in FIG. 1.

FIG. 3 is a schematic block diagram of the camera 14 separated from the system 10. The camera 14 includes a lens 34 that receives radiation from the scene, including the millimeter-wave radiation signals 16 from the beacons 12. The lens 34 focuses the radiation from the scene onto a focal plane array of the type discussed in the '336 patent above. The focal plane array includes a plurality of receivers 32, where each receiver 32 includes the various elements for detecting and processing millimeter-wave radiation. Each receiver 32 includes a suitable antenna 36, a millimeter-wave radiation detector 38 and a demodulator 40. In this example, there are three separate receivers 32 shown, however, in a working embodiment, there would be an array of many of such receivers. The detector 38 in each receiver 32 can be any suitable millimeter-wave detector known in the art, such as the detectors in the '336 patent discussed above. The detectors 38 detect the radiation signals 16 received by the antennas 36, and generate an indicative electrical signal therefrom.

The electrical signals generated by the detectors 38 can then be used to generate the gray-scale image 18. Additionally, the electrical signals are sent to the demodulator 40 in each of the receivers 32 to demodulate and decode the beacon signals to identify which beacon is at what location, as in the decoded image 30. Thus, the radiation signal 16 is detected, rectified and turned into a voltage whose amplitude is directly related to the incoming radiation amplitude. The demodulator 40 would include the hardware necessary to demodulate any of the various modulation schemes identified above in various applications, as would be well understood to those skilled in the art.

Figure 4:
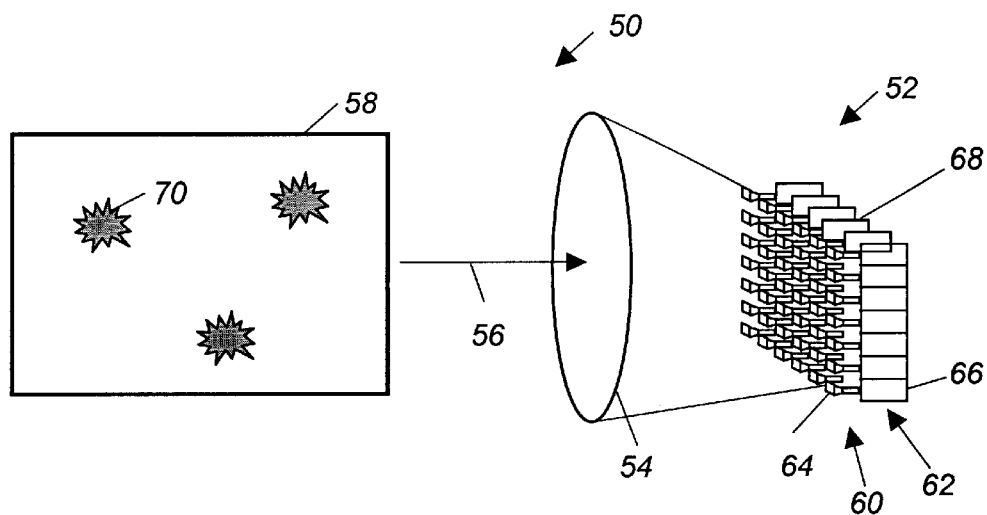
FIG. 4 is a plan view of a scene including a plurality of beacon signals and a millimeter-wave camera including a receiver array, according to the invention.

FIG. 4 is a plan view of an imaging system 50, that further describes the present invention. The imaging system 50 includes a PMMW camera 52 including a focusing lens 54 that focuses incoming radiation 56 from a scene 58 onto a focal plane array 60. The focal plane array 60 includes a plurality of receivers 62, each including an antenna 64 and a detector/demodulator circuit 66 fabricated on a millimeter wave/microwave monolithic integrated circuit (MMIC). In one example, the focal plane array 60 is made up of a plurality (such as twenty-six) of adjacent integrated circuit cards 68, where each card 68 includes forty receivers 62. Various beacon signals 70 within the scene 58 are detected and decoded by the array 60 to specifically identify separate beacons in the scene 58.

Figure 5:
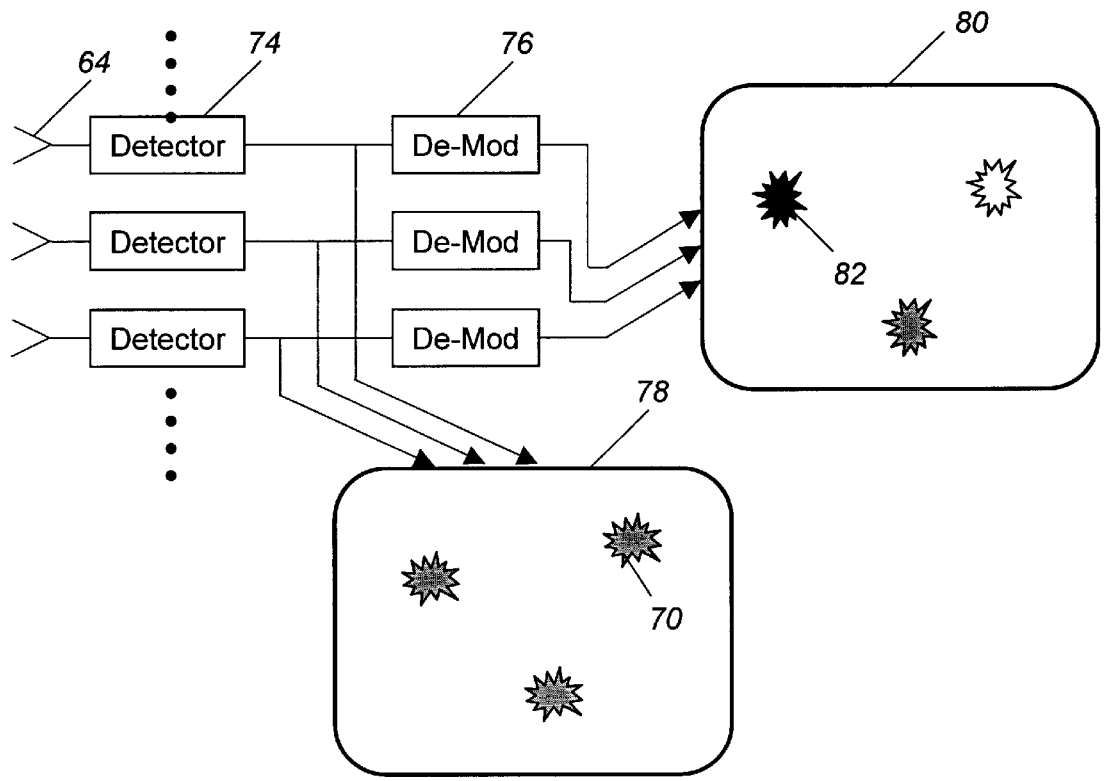
FIG. 5 is a schematic block diagram of a plurality of receiver channels in the camera shown in FIG. 4.

FIG. 5 is a schematic block diagram showing the receivers 62 in the focal plane array 60 including the antenna 64, a detector 74 and a demodulator 76 that operate in, the same manner as discussed above. The detected radiation signals from the scene 58 can provide a gray-scale image 78 of the beacons signals 70, or once the various signals are demodulated by the demodulator 76, can provide a decoded image 80 of the beacon signals 82.

As discussed above, the present invention provides an imaging system that identifies the location of transmitter beacons in the scene, and is also able to distinguish and/or communicate with the transmitter beacons. In the millimeter-wave frequency range, this provides the advantages of being able to image and communicate through obscured atmospheric conditions. A specific example includes an imaging system for the search and rescue of a downed pilot who may be transmitting with one of the beacons discussed above. With the beacon, the downed pilot's position can be identified and the pilot can communicate with the rescuers. In other examples, the beacons may be lights at a landing strip, where different lights employ different modulation schemes to identify different things such as runways, taxiways, vehicles and other objects in the scene. Additionally, the signals can be modulated in such a way so that they are coded for covert operations. Further, the discussion above discloses imaging a scene, and includes video type imaging and still images.

Although the invention discussed above is directed to millimeter-wave frequencies, there may be other applications for other frequencies. The present invention is thus extendable to those frequencies that allow a signal to be detected, where the signal can be modulated for communications purposes.

The foregoing discussion discloses and describes merely exemplary embodiments of the present invention. One skilled in the art will readily recognize from such discussion and from the accompanying drawings and claims, that various changes, modifications and variations can be made therein without departing from the spirit and scope of the invention as defined in the following claims.

What is claimed is:

1. A millimeter-wave imaging system for generating an image of a scene, said system comprising:

two or more beacons in the scene transmitting a millimeter-wave radiation signal, each of said beacons including a modulator that modulates the millimeter-wave signal in a distinct manner with an identifier indicative of the beacon; and a millimeter-wave camera independently located from the beacons responsive to the radiation signal from the beacons, said camera including a plurality of receivers, each receiver including an antenna, a detector and a demodulator, said antenna receiving the signal, said detector converting the signal to an electrical representation, and said demodulator demodulating the signal to determine the identifier of each of the beacons in the image to distinguish and decipher the beacons.

2. The system according to claim 1 wherein the modulator modulates the signal by any one or combination of the modulation schemes selected from the group consisting of amplitude modulation, phase modulation, frequency modulation and quadrature amplitude modulation.

3. The system according to claim 1 wherein the plurality of receivers are formed in a focal plane array, where the receivers are integrated on a monolithically integrated circuit.

4. The system according to claim 1 wherein the modulator modulates the millimeter-wave signal to provide a communications signal.

5. The system according to claim 1 wherein the at least one beacon is a plurality of beacons each including a modulator, wherein each modulator in the different beacons modulates the millimeter-wave radiation signal with an identifier indicative of the beacon so that the camera demodulates the received millimeter-wave radiation signals and is able to distinguish each beacon in the scene.

6. The system according to claim 5 wherein the camera provides a gray-scale image of the beacons and a decoded image of the beacons identifying each separate beacon in the image.

7. The system according to claim 3 wherein the camera includes a lens, said lens having a focal point at the focal plane array.

8. An imaging system for generating an image of a scene, said system comprising:

at least one transmitter transmitting a radiation signal, said transmitter including a modulator that modulates the signal with an identifier indicative of the transmitter; and a camera responsive to the radiation signal from the transmitter, said camera including an array of receivers, where each receiver includes a detector and demodulator, said detector converting the signal to an electrical representation and said demodulator demodulating the signal to determine the identifier of the transmitter so that the image includes a location and identification of the transmitter in the image.

9. The system according to claim 8 wherein the modulator modulates the signal by any one or combination of the modulation schemes selected from the group consisting of amplitude modulation, phase modulation, frequency modulation and quadrature amplitude modulation.

10. The system according to claim 8 wherein the modulator modulates the radiation signal to provide a communications signal.

11. The system according to claim 8 wherein the at least one transmitter is a plurality of transmitters each including a modulator, wherein each modulator in the different transmitters modulates the radiation signal with an identifier indicative of the transmitter so that the camera demodulates the received radiation signals and is able to distinguish the transmitters in the scene and decipher their signals.

12. The system according to claim 11 wherein the camera provides a gray-scale image of the transmitters and a decoded image of the transmitters identifying each separate transmitter in the image.

13. A method of imaging a scene, comprising:

transmitting millimeter-wave radiation signals from at least one beacon in the scene where the beacon modulates the millimeter-wave signals with an identifier indicative of the beacon;

detecting the millimeter-wave signals in a plurality of receivers;

demodulating the detected signals to determine the identifier of the beacon; and imaging the detected signals to identify the location of the beacon in the scene and communicate with the beacon.

14. The method according to claim 13 wherein transmitting millimeter-wave radiation signals including transmitting modulated millimeter-wave radiation signals for communications purposes.

15. The method according to claim 13 wherein transmitting millimeter-wave radiation signals from at least one beacon includes transmitting millimeter-wave radiation signals from a plurality of beacons, and wherein demodulating and imaging the detected signals includes identifying the location of the plurality of beacons in the scene.

16. The method according to claim 13 wherein imaging the detected signals includes generating a gray-scale image of the beacon and generating a decoded image of the beacon identifying the beacon.

* * * * *